United States Patent
Marshall et al.

(10) Patent No.: US 7,233,197 B2
(45) Date of Patent: *Jun. 19, 2007

(54) METHODS AND SYSTEMS FOR REDUCING LEAKAGE CURRENT IN SEMICONDUCTOR CIRCUITS

(75) Inventors: Alan Marshall, Bristol (GB); Andrea Olgiati, Newport (GB); Anthony I. Stansfield, Bristol (GB)

(73) Assignee: Panasonic Europe Ltd., Middlesex (GB)

(*) Notice: Subject to any disclaimer, the term of this patent is extended or adjusted under 35 U.S.C. 154(b) by 0 days.

This patent is subject to a terminal disclaimer.

(21) Appl. No.: 11/006,974

(22) Filed: Dec. 7, 2004

(65) Prior Publication Data
US 2005/0083107 A1 Apr. 21, 2005

Related U.S. Application Data

(62) Division of application No. 10/628,906, filed on Jul. 28, 2003, now Pat. No. 6,946,903.

(51) Int. Cl.
*H01L 25/00* (2006.01)

(52) U.S. Cl. ........................ 327/566; 327/530

(58) Field of Classification Search ................ 327/108, 327/112, 185; 326/56, 82–83, 85–87, 91, 326/112–115, 119, 121–122; 365/189.12, 365/240

See application file for complete search history.

(56) References Cited

U.S. PATENT DOCUMENTS

| | | | |
|---|---|---|---|
| 4,926,070 A | 5/1990 | Tanaka et al. | |
| 5,541,529 A | 7/1996 | Mashiko et al. | |
| 5,654,660 A | 8/1997 | Orgill et al. | |
| 5,684,415 A | 11/1997 | McManus | |
| 5,767,728 A | 6/1998 | Michail et al. | |
| 5,828,231 A | 10/1998 | Bazargan | |
| 5,894,227 A | 4/1999 | Acuff | |
| 6,090,153 A | 7/2000 | Chen et al. | |
| 6,118,303 A | 9/2000 | Schmitt et al. | |
| 6,208,171 B1 | 3/2001 | Kumagai et al. | |
| 6,211,725 B1* | 4/2001 | Kang | 327/534 |
| 6,242,943 B1 | 6/2001 | El-Ayat | |
| 6,285,213 B1 | 9/2001 | Makino | |
| 6,320,418 B1* | 11/2001 | Fujii et al. | 326/93 |
| 6,356,481 B1 | 3/2002 | Micheloni et al. | |
| 6,384,628 B1 | 5/2002 | Lacey et al. | |
| 6,384,639 B1* | 5/2002 | Chen et al. | 327/88 |
| 6,940,307 B1* | 9/2005 | Liu et al. | 326/38 |
| 2002/0079927 A1 | 6/2002 | Katoh et al. | |

FOREIGN PATENT DOCUMENTS

| | | |
|---|---|---|
| JP | 59208926 | 11/1984 |
| JP | 62136914 | 6/1987 |
| JP | 62178015 | 8/1987 |

* cited by examiner

OTHER PUBLICATIONS

"108 Appendix B—FBGA Circuitry and Process Modeling—B.1.1 FPGA Routing Structures", Architecture and CAD for Deep-Submicron FBGA, (Betz, Rose, and Marquardt), Kluwer-Academic Publisher, 1999.

*Primary Examiner*—My-Trang Nu Ton
(74) *Attorney, Agent, or Firm*—Orrick, Herrington & Sutcliffe LLP

(57) ABSTRACT

Leakage currents across circuit components such as transistors are avoided by placing circuits into a low-leakage standby mode. The circuits are configured such that voltage differentials across leakage-prone circuit components are avoided when in standby mode. Various means are used to configure the circuits, such as configuration ports, data input lines, scan chains, etc. In embodiments containing reconfigurable devices, low-threshold transistors are used to implement the routing network.

25 Claims, 13 Drawing Sheets

AND-OR-INVERT GATE
OUT = NOT (A.B|C.D.)

NOR GATE

NAND GATE

METHODS AND SYSTEMS FOR REDUCING LEAKAGE CURRENT IN SEMICONDUCTOR CIRCUITS

This application is a divisional application of U.S. Ser. No. 10/628,906 filed on Jul. 28, 2003 now U.S. Pat. No. 6,946,903, all of which is expressly incorporated herein by reference.

BACKGROUND AND SUMMARY

The invention relates to semiconductor devices. More particularly the invention relates to improvements in the configuration of circuits constructed from semiconductor devices to reduce leakage current in the circuits.

Throughout the specification, P and N-channel MOS (metal oxide semiconductor) devices (PMOS and NMOS) are described in terms of their respective gate, drain and source nodes to help clarify the structure and operation of the alternative embodiments. PMOS devices transmit positive current when the signal on the gate is low, and cease transmitting positive current when the signal on the gate is high. NMOS devices transmit positive current when the signal on the gate is high, and cease transmitting positive current when the signal on the gate is low.

According to standard convention, positive current flows from the drain to the source node in NMOS devices, and flows from the source to the drain in PMOS devices. The source and drain node conventions are used only to help describe the structure and operation of embodiments of the invention and are not intended to limit the scope of the invention. It is possible to operate MOS transistors in reverse, especially if the source and drain regions are symmetrical. As such, the relative positions of the drain and source are not critical to the disclosed embodiments of the invention.

Semiconductor processes are continually evolving to meet demands for increased performance, reduced cost and reduced power consumption. Currently the mainstream technology for meeting these needs is silicon CMOS technology. CMOS is a particular form of MOS technology in which two types of transistors are used—NMOS and PMOS—hence the name Complementary MOS or CMOS. There are also NMOS and PMOS forms of MOS technology, which use exclusively NMOS and PMOS transistors respectively.

The feature size of CMOS circuits is being steadily reduced as manufacturers strive to be competitive on performance, cost and power consumption. The smaller the feature size ("geometry") of a process, the lower the voltage at which circuits designed in the process can operate without having failures due to voltage breakdown.

Silicon CMOS processes use MOS transistors. MOS transistors have a channel between two terminals called the source and the drain. The current that flows between the source and drain can be controlled by changing the voltage on a third terminal, called the gate. For a given voltage between the source and the drain, the current that flows between the source and drain is a complex function of the voltage on the gate. This function is commonly divided into 3 regions that, taken together, give a good approximation to the behaviour of a MOS transistor:

1. If the voltage difference between gate and source, $V_{gs}$, is less than a threshold value, $V_t$, the drain-source current, $I_{ds}$, varies exponentially with both $V_{gs}$ and $V_{ds}$ (the drain-source voltage). This is commonly referred to as the 'Subthreshold' region.
2. If $V_{gs} \geq V_t$, and also $V_{gs} \geq V_{ds}$, $I_{ds}$ varies linearly with both $V_{gs}$ and $V_{ds}$. (the 'Linear' region)
3. If $V_{ds} > V_{gs} > V_t$, $I_{ds}$, varies quadratically with $V_{gs}$, but is (almost) independent of $V_{ds}$ (the 'Saturated' region).

This relationship is depicted in FIG. 1 for an NMOS transistor, and in FIG. 2 for a PMOS transistor.

In a digital circuit, the typical operating points of interest are the transistor being fully on or fully off, controlled by the gate voltage being either the minimum (Gnd) or the maximum ($V_{dd}$) voltage in the circuit. For an NMOS transistor, the fully on state corresponds to the gate being coupled to the most positive voltage in the circuit ($V_{dd}$), and the fully off state to the gate being coupled to the most negative voltage in the circuit (Gnd). From the above definitions, an on transistor is in the linear region, and an off transistor in the sub-threshold region. PMOS transistors have a complementary behaviour to NMOS transistors—they are fully on when their gates are coupled to the most negative voltage in the circuit (Gnd), and fully off when their gates are coupled to the most positive voltage in the circuit ($V_{dd}$).

Some digital circuit components, such as pass transistors, can degrade the $V_{dd}$ and Gnd voltages discussed above. These degraded voltages are, however, still sufficient to generate the on and off states discussed above. Thus either a fill or degraded $V_{dd}$ signal can serve as a logical high, and either a full or degraded Gnd signal can serve as a logical low signal for the digital circuit.

"Coupling" as used herein may be either a direct coupling between the two enumerated elements, or an indirect coupling through other elements between the enumerated elements. For example, the gate of the PMOS transistor discussed above may be directly coupled to $V_{dd}$, or the gate of the PMOS transistor may be indirectly coupled to $V_{dd}$ through another PMOS transistor, or some other element. An example of this latter indirect coupling is shown in FIG. 10B, where the gate of transistor P2 is coupled to $V_{dd}$ via transistor P1.

Turning to FIG. 3, since the subthreshold region has an exponential dependence of $I_{ds}$ on $V_{gs}$, the current drops dramatically as $V_{gs}$ falls below the threshold level. When analysing the behaviour of digital circuits it is therefore common to regard an off transistor as carrying no current, and an on transistor as capable of carrying a high current. This is however an approximation, and in modern CMOS processes the validity of this approximation is under threat.

As CMOS technology moves to smaller and smaller geometries, the operating voltage of CMOS circuits is being steadily reduced to stay within the operating voltage limits of the smaller geometry processes. As the operating voltage reduces, so does the maximum voltage ($V_{dd}$) that can be coupled to the gate of an NMOS transistor in the circuit, and therefore the current that can be carried by a fully on transistor is reduced. FIG. 4 depicts the current flow through an NMOS transistor using a smaller geometry than the NMOS transistor current flow graph of FIG. 3. The operating speed of a CMOS circuit is typically determined by the rate at which charge can be moved on and off the parasitic capacitances in the circuit via the on transistors, so any reduction in the ability of the transistors to conduct current will lead to an increase in the time required to move this charge, and therefore to a reduction in the operating speed of the circuit. Thus as the operating voltage limits on transistors become smaller, the transistors become slower. It is possible to correct for this effect by reducing the threshold voltage of the transistors—the lower the threshold voltage, the higher the current that can be carried by a fully on transistor.

However, there is another effect to consider that restricts the CMOS process developer's freedom to reduce the threshold voltage. If the threshold voltage is reduced, the subthreshold region is correspondingly reduced. Therefore, an off transistor is not so far into the subthreshold region, and so the current through an off transistor (commonly referred to as the leakage current) will be increased. For example, comparing FIG. 4 with FIG. 5, FIG. 4 depicts an NMOS transistor having a threshold voltage $V_t$, and FIG. 5 depicts a second NMOS transistor having a threshold voltage $V_{t'}$, lower than $V_t$. Because of the exponential dependence of subthreshold current on gate voltage, a small reduction in threshold voltage can lead to a large increase in leakage current.

For process geometries of about 0.13 µm and below it is no longer possible to find a single choice of threshold voltage that is suitable for both high speed and low leakage circuit operation. Instead, such processes commonly offer the circuit designer a choice of two or more types of NMOS (and PMOS) transistors, with different threshold voltages.

The highest threshold voltage transistor will have the lowest leakage current when turned fully off, and will conduct the smallest current when turned fully on. The current conducted when the transistor is turned fully on will limit the performance of many circuits.

The lowest threshold voltage transistor will have the highest leakage current when turned fully off, and will conduct the largest current when turned fully on. The current conducted when the transistor is turned fully on will provide the highest performance circuits. However, the high leakage current (which may be thousands of times higher than the leakage current of a highest threshold transistor of the same size) will often mean that these low $V_t$ transistors can only be used in portions of circuits that are time-critical, or where power dissipation is not a concern for some other reason.

Typically the designer's concern for the level of leakage current is not related to ensuring correct circuit operation, but is related to minimising power dissipation. For portable electronic devices this equates to maximising battery life. For example, mobile phones need to be powered for extended periods (known as standby mode, during which the phone is able to receive an incoming call), but are fully active for much shorter periods (known as talk or active mode, while making a call). When an electronic device such as a mobile phone is in standby mode, certain portions of the circuitry within the electronic device, which are active when the phone is in talk mode, are shut down. These circuits, however, still have leakage currents running through them, even though they have been de-activated. Even if the leakage current is much smaller than the normal operating current of the circuit, the leakage current depletes the battery charge over the relatively long standby time, whereas the operating current during talk time only depletes the battery charge over the relatively short talk time. As a result, the leakage current has a disproportional effect on total battery life, making leakage current an important design constraint.

Therefore, systems and methods are needed to allow low threshold transistors to be used where advantageous for circuit performance, while reducing the constraints on their use imposed by leakage current, for example in an idle or standby mode. Additionally, there is a need for systems and methods to minimise leakage current in active circuits, such as circuits in a run mode, by providing settings of unused portions of the active circuit that are chosen to minimise the leakage current.

BRIEF DESCRIPTION OF THE DRAWINGS

The accompanying drawings are included to provide a further understanding of embodiments of the invention and together with the Detailed Description, serve to explain the principles of the embodiments disclosed.

DETAILED DESCRIPTION OF THE PREFERRED EMBODIMENTS

The description of the preferred embodiments of the invention, below, will be made with reference to transistors within a reconfigurable device, such as a Field-Programmable Gate Array (FPGA) or a Reconfigurable Arithmetic Array (RAA). Those skilled in the art will recognize that alternative embodiments of the invention are possible using other types of circuits, such as programmable MOS circuits, tri-state drivers, buffers, bus switches or barrel shifters.

A reconfigurable device is a semiconductor device that is adapted to be configured to operate in a variety of different modes, and to perform a variety of different functions. In the operation of a typical reconfigurable device, during a configuration mode the device is first configured to perform a particular function. Example functions include digital signal processing, graphics processing, array computing, etc. Once the reconfigurable device has been configured, it then switches to an operating mode, where the configured function is executed. Once the execution of the configured function is completed, the reconfigurable device may then be reconfigured for a different function, by re-entering the configuration mode and having a new function configured into the reconfigurable device.

Figure 6:
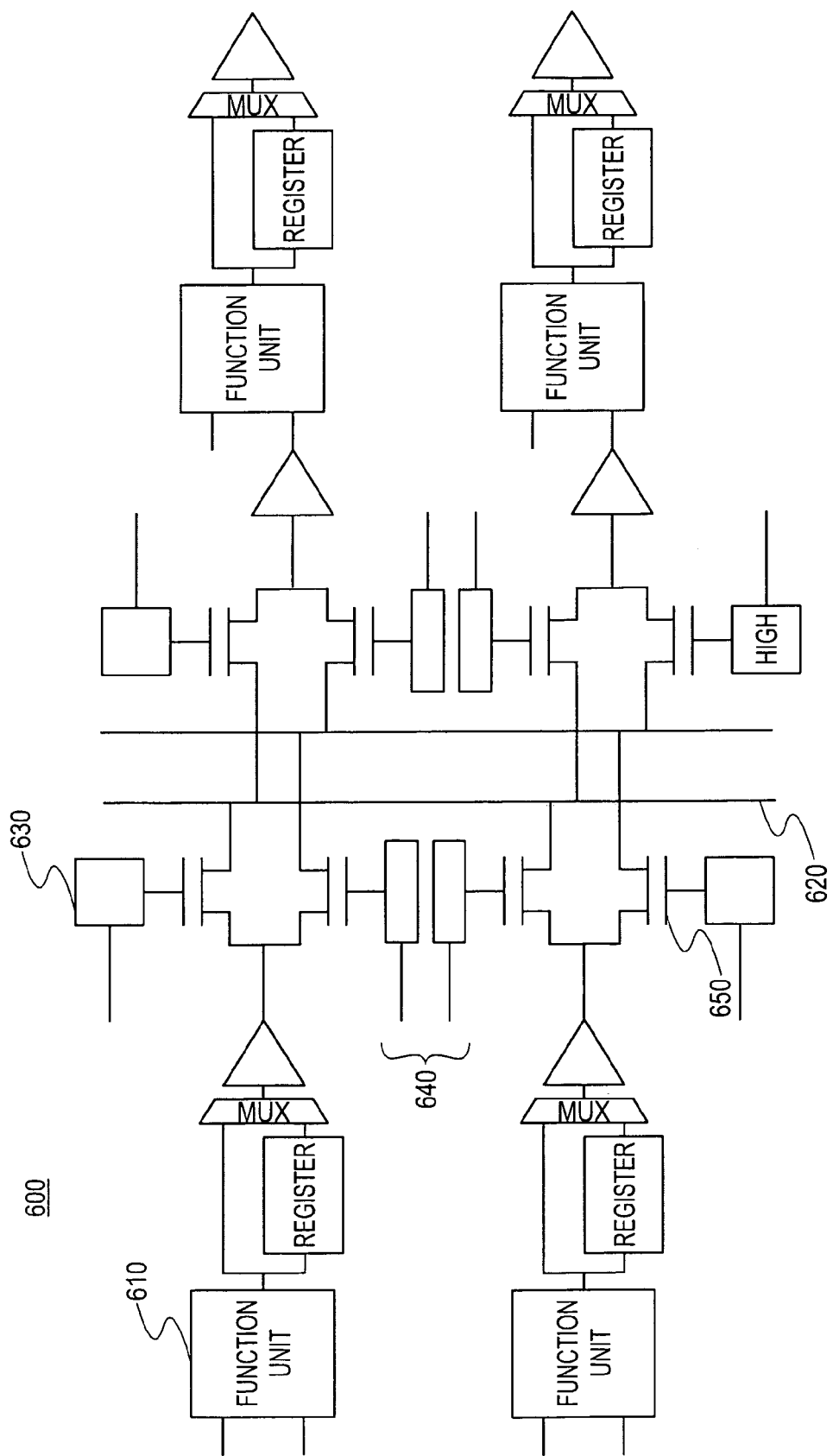
FIG. 6 is a portion of a reconfigurable device circuit.

Turning to FIG. 6, an example reconfigurable device 600 includes the following components:

An array of functional units 610, for example Look-up Tables (LUTs) in an FPGA, Arithmetic and Logic Units (ALUs) in an RAA, together with memories, registers and multiplexers. These functional units are adapted to perform a variety of different functions, depending on how they are configured.

A routing network 620, to allow the functional units to be interconnected as required by a particular application. This routing network is adapted to allow for a wide variety of interconnections between the functional units, as determined by the configuration of the device.

One or more configuration memories 630, to hold the data that specifies the functions of the functional units, and the interconnection pattern implemented by the routing network.

An interface 640 to allow configuration data to be written into the device.

Some "backplane" circuitry coupled to the interface 640, to distribute the configuration data and other signals such as clocks and control signals within the device.

In many reconfigurable devices, the routing network is the largest of these components. It is advantageous for the routing network to provide as much flexibility of interconnection pattern among the functional units as possible. In general, achieving the required flexibility of interconnection pattern requires the routing network to comprise a large number of switches, such as the switches 650 shown in FIG. 6. Hence some design objectives for an individual interconnect switch are:

Small area.

Ability for the switch state (on or off) to be controlled from the configuration memory.

Ability to transmit signals down the desired path with low delay and power consumption.

A turned off switch should have minimum impact (speed, power consumption) on the rest of the circuit.

There are several options for implementing the switches in a reconfigurable device, which may be used singly or in combination:

1. Pass Transistor Switch

Figure 7:
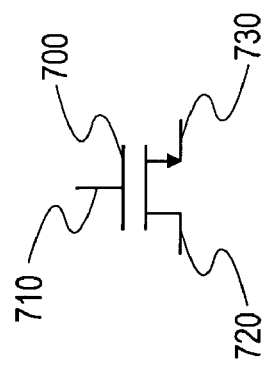
FIG. 7 is an NMOS pass transistor switch.

This is the simplest possible switch. Turning to FIG. 7, an NMOS pass transistor switch has a single NMOS transistor 700 whose gate 710 is controlled by the configuration memory (not shown), and whose drain 720 and source 730 terminals are coupled to signal wires in the interconnect. When the gate voltage is driven high (for NMOS pass transistors), the switch is turned on and current can flow through the transistor 700, from the drain 720 to the source 730. When the gate voltage is driven low, the switch is turned off and no current can flow through the transistor 700, other than some leakage current. The voltage propagated from drain to source by an NMOS pass transistor is limited to the lower of the drain voltage and the gate voltage less the threshold voltage, and therefore cannot exceed Vgate—$V_t$. It is therefore advantageous for pass transistor switches to be built from lower threshold voltage transistors to avoid excessive signal level degradation, especially in circuits with lower operating voltages. Additionally, as lower threshold transistors are more conductive than higher threshold transistors, operating frequency is improved by the use of lower threshold transistors in pass transistor switches. However, when pass transistors are turned off, a leakage current may pass through them. The leakage through large numbers of low threshold pass transistor switches which are turned off can be excessive, which can be a serious design constraint.

2. Complementary Switch

Figure 8:
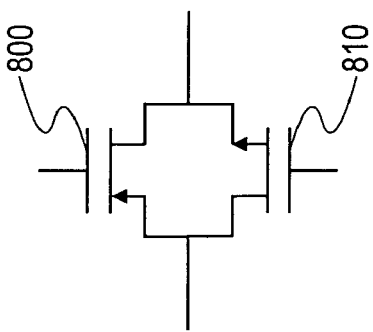
FIG. 8 is a complementary switch.

Turning to FIG. 8, this switch includes a PMOS transistor 800 and an NMOS transistor 810 connected in parallel, with their gates controlled by complementary signals from a bit in the configuration memory. Unlike the pass transistor switch it does not degrade the signal level. As with pass transistor switches, operating frequencies are improved by the use of lower threshold, more conductive, transistors in complementary switches. Leakage through large numbers of low threshold complementary switches that are turned off can be a serious design constraint, just as for pass transistor switches.

3. Controlled Buffer

Figure 9:
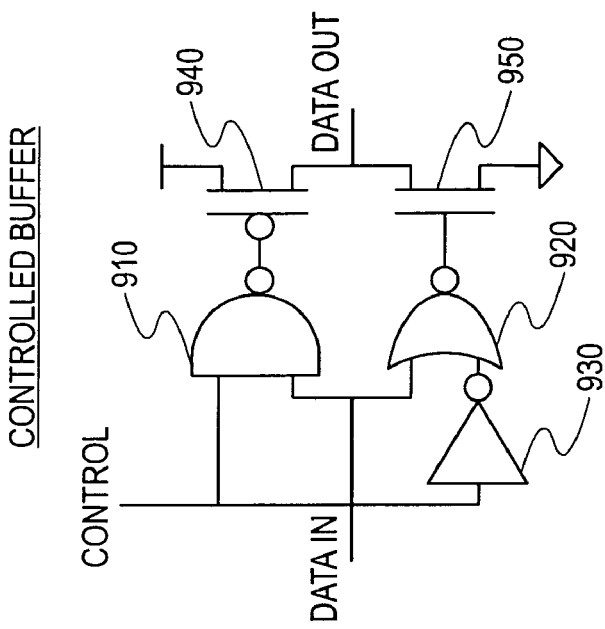
FIG. 9 is a controlled buffer circuit.

Turning to FIG. 9, a controlled buffer includes a NAND gate 910, a NOR gate 920, an inverter 930, a PMOS transistor 940 and an NMOS transistor 950. The data input is NAND'ed and NOR'ed with a control signal, to generate the control signals for the PMOS transistor 940 and the NMOS transistor 950. By combining the data input with the control signal in this way, the controlled buffer "re-powers" a signal that it propagates, and so appropriate use of controlled buffers can offset the poor operating frequency caused by long chains of pass transistor switches or complementary switches. These buffers are, however, substantially larger than pass transistor switches or complementary switches.

4. Multiplexer

Multiplexers allow one of several input signals to be connected to one output signal. It is appropriate to use multiplexers when the required pattern of connectivity can exploit this pattern of connections.

Considering the range of switch options available, it is often advantageous to use pass transistor switches and complementary switches on account of their small size. This is true even if these types of switch need to be supplemented with controlled buffers for improved performance.

Figure 10C:
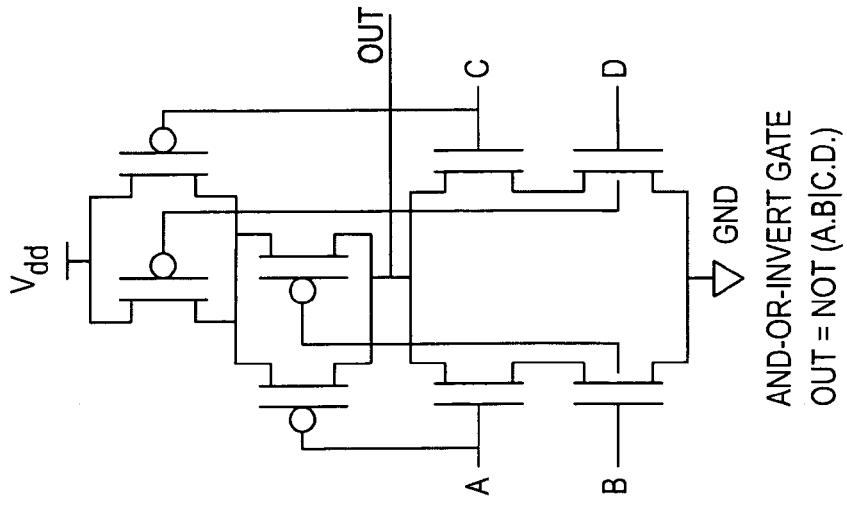
FIG. 10C is a CMOS AND-OR-Invert gate.
Figure 10B:
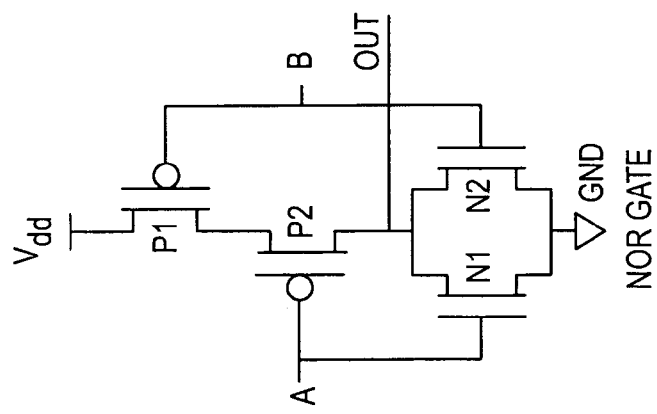
FIG. 10B is a CMOS NOR gate.
Figure 10A:
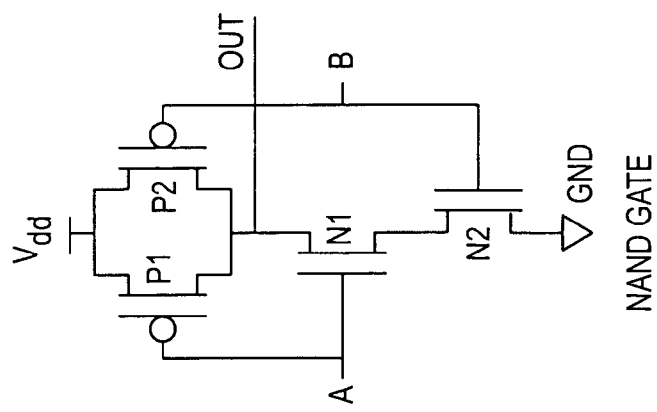
FIG. 10A is a CMOS NAND gate.

Standard CMOS logic gates (examples of which are shown in FIG. 10A–C) include a network of PMOS transistors connected between $V_{dd}$ and the output of the gate, and a network of NMOS transistors connected between the output and Gnd. Thus the output is either pulled up via the PMOS network, or pulled down via the NMOS network. The inputs to the logic gate are connected to the gates of the NMOS and PMOS transistors, and turn the transistors on and off. If the inputs create a path from $V_{dd}$ through a sequence of on PMOS transistors to the output, then the output will be pulled up, and if the inputs create a path from Gnd through a sequence of on NMOS transistors to the output, then the output will be pulled down.

For example, turning to the NAND gate of FIG. 10A, if either input A or B is low, then the corresponding PMOS transistor P1, P2 will be turned on, and a path from $V_{dd}$ to the output is opened. At the same time, at least one of the NMOS transistors N1, N2 will be turned off by the low input on one or more of inputs A and B, thus blocking the path from Gnd to the output. If both of the inputs A and B are high, however, then both of the PMOS transistors P1 and P2 are turned off, blocking the path from $V_{dd}$ to the output. At the same time, both of the NMOS transistors N1 and N2 are turned on, creating a path from Gnd to the output, which pulls the output down to Gnd. Thus, if either input is low, the output is high, and if both inputs are high, the output is low, which is the proper implementation of the NAND function.

The gates of FIGS. 10B and 10C function in a similar fashion, wherein a path is created between either $V_{dd}$ and the output, or Gnd and the output, depending on the values received at the inputs.

The inputs are coupled to the transistor gates in such a way that for all valid input combinations there is either a path from $V_{dd}$ to the output, or a path from Gnd to the output, but not both. Therefore there is never a path from $V_{dd}$ to Gnd through a sequence of on PMOS and NMOS transistors (such a path would result in a high current flow from $V_{dd}$ to Gnd) and there is always at least one off transistor in all possible paths between $V_{dd}$ and Gnd. However, there is still the possibility of leakage current through that one (or more) off transistor, and therefore each logic gate is potentially a cause of leakage current.

These CMOS logic gates can be constructed using a mixture of both high- and low-threshold transistors. A gate constructed with just low-threshold transistors will be fast, but also have high leakage currents, while replacing all the transistors with high-threshold versions results in a gate that is slower, but with significantly lower leakage currents. A gate with a mixture of high- and low-threshold transistors will have a composite performance, depending on the thresholds of the individual transistors, and the particular combination of inputs. For example, returning to the NAND gate of FIG. 10A:

If the two PMOS transistors (P1, P2) are both low-threshold, and the two NMOS transistors (N1, N2) both high-threshold, then when any input (A, B) goes low the output will rise faster than for a NAND gate with just high-threshold transistors. If any input is low then the gate will have low leakage (since there is at least one off high-threshold transistor between Vdd and Gnd), but if both inputs are high then it will have high leakage, since the only off transistors in the $V_{dd}$-to-Gnd path will be the two parallel low-threshold PMOS devices P1 and P2.

If transistors P1 and N1 (the two transistors coupled to input A) are both made low-threshold then any output change due to a change on input A will propagate faster than in the high-threshold-only case. However, the gate will have higher leakage if input B is high, since then there will always be a path from $V_{dd}$ to Gnd that does not include an off high-threshold transistor.

If just N1 is made low-threshold, then a falling output transition due to a change on the A input will be faster than in the high-threshold case. Leakage will only be increased when the A input is low and the B input high, since for all other input combinations there will always be an off high-threshold transistor between $V_{dd}$ and Gnd.

Thus the designer is able to choose to create fast paths through a gate, but may have to accept some increased leakage in order to do so. It is possible to avoid any increase in leakage if the modified gate always has at least one off high-threshold transistor between $V_{dd}$ and Gnd for all valid input combinations, but if this condition is not met then there will be input combinations that result in high leakage.

Figure 1:
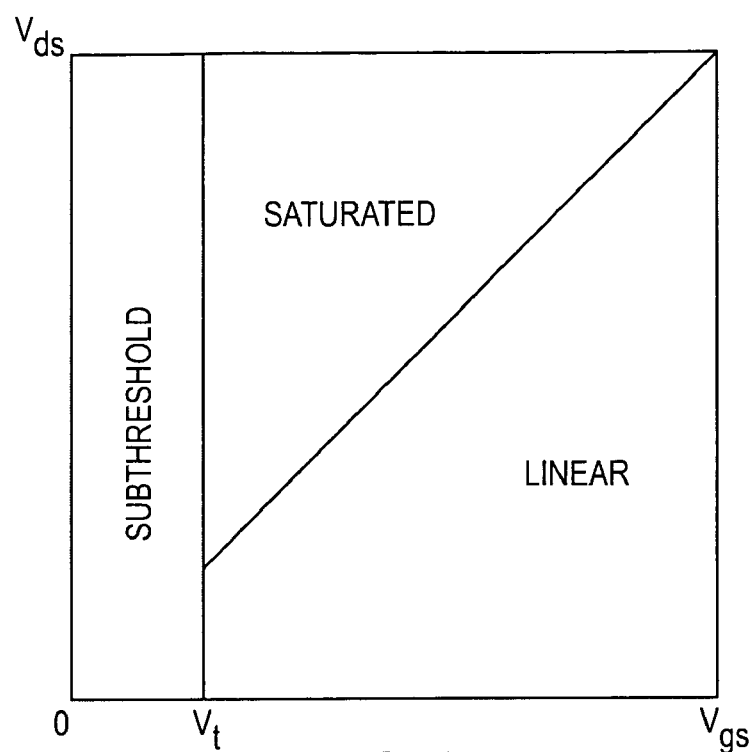
FIG. 1 is a graph of voltages in an NMOS transistor.
Figure 2:
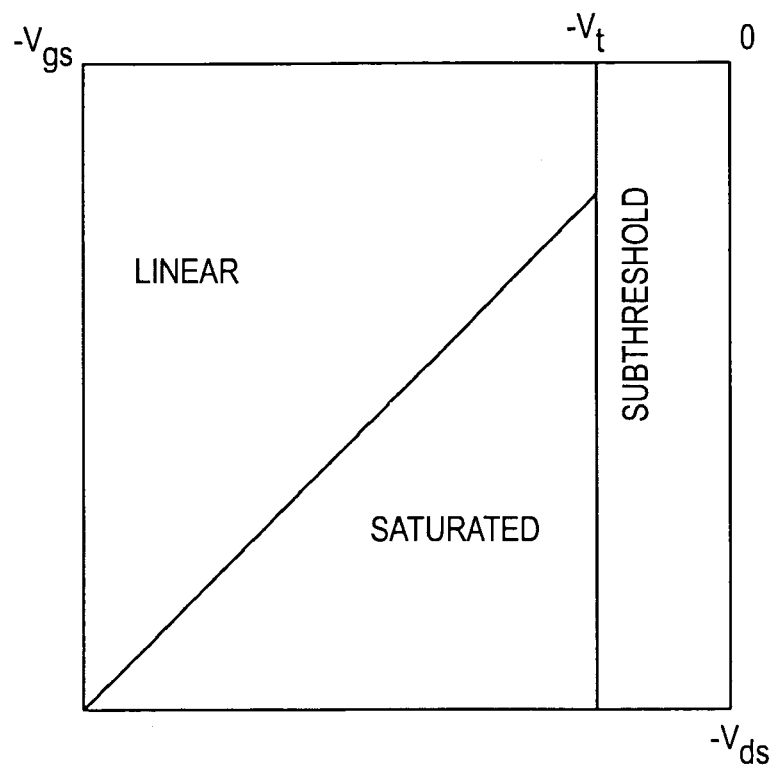
FIG. 2 is a graph of voltages in a PMOS transistor.
Figure 3:
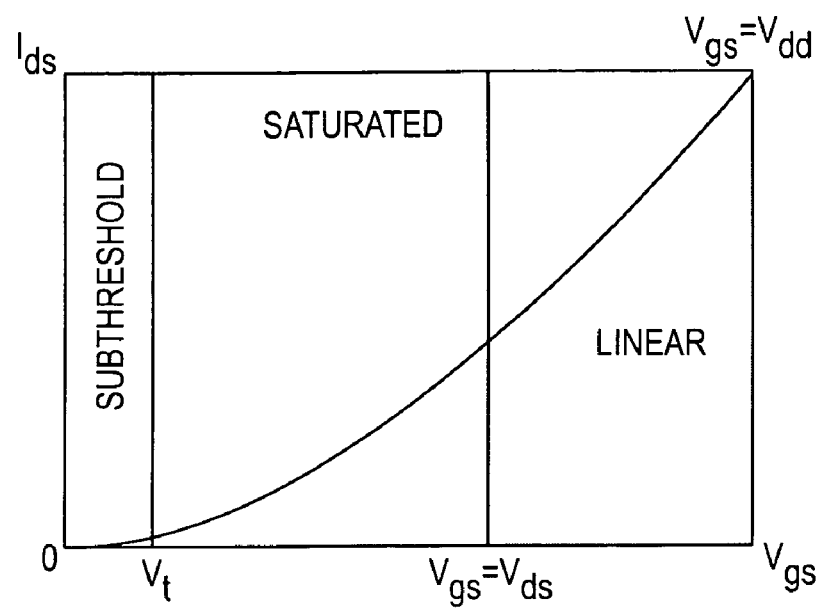
FIG. 3 is a voltage current graph of an NMOS transistor having a relatively high maximum voltage $V_{dd}$.
Figure 4:
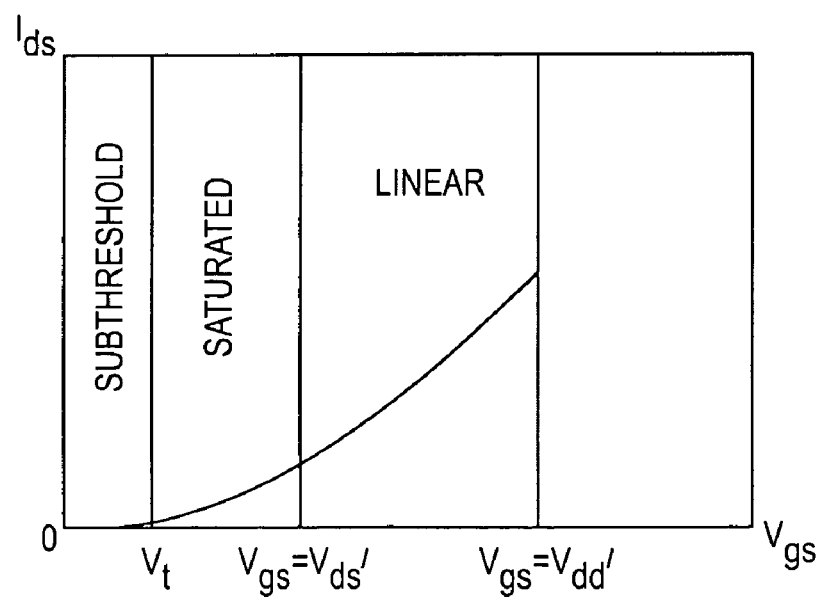
FIG. 4 is a voltage current graph of an NMOS transistor having a relatively low maximum voltage $V_{dd}$ and a relatively high threshold voltage $V_t$.
Figure 5:
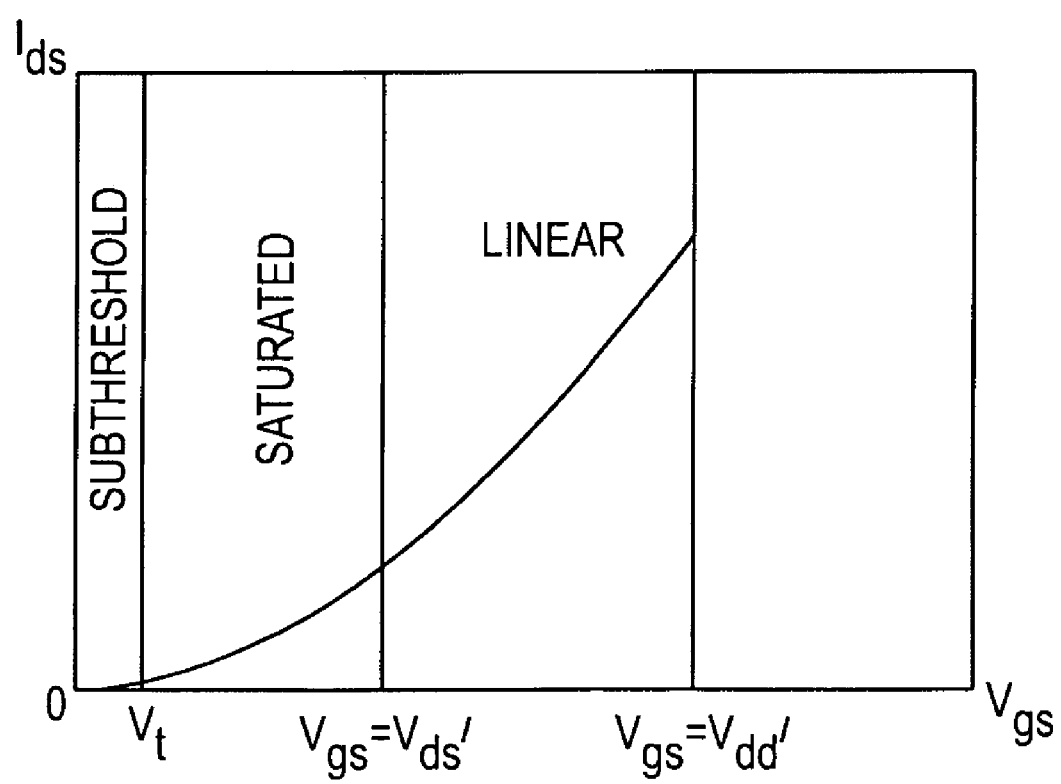
FIG. 5 is a voltage current graph of an NMOS transistor having a relatively low maximum voltage $V_{dd}$ and a relatively low threshold voltage $V_t$.

There are two ways in which low-threshold transistors can be used to make a circuit faster:

A low-threshold transistor can carry more current than a high-threshold one of the same size, so if a high-threshold transistor in a gate is replaced with a low-threshold one of the same size the gate will be able to carry a higher current. Therefore the gate will be able to charge or discharge its load capacitance faster. This relationship is seen by comparing the current-voltage graph of the high-threshold transistor shown in FIG. 4 with the current-voltage graph of the low-threshold transistor shown in FIG. 5.

Alternatively, a small low-threshold transistor can carry the same current as a larger high-threshold transistor, but has a smaller gate capacitance. If a high-threshold transistor is replaced with a low-threshold one with the same current carrying capacity then the ability of the gate to charge or discharge its load capacitance is unchanged, but its input capacitance is reduced, and therefore the gate that drives its input is able to do so faster.

Figure 11:
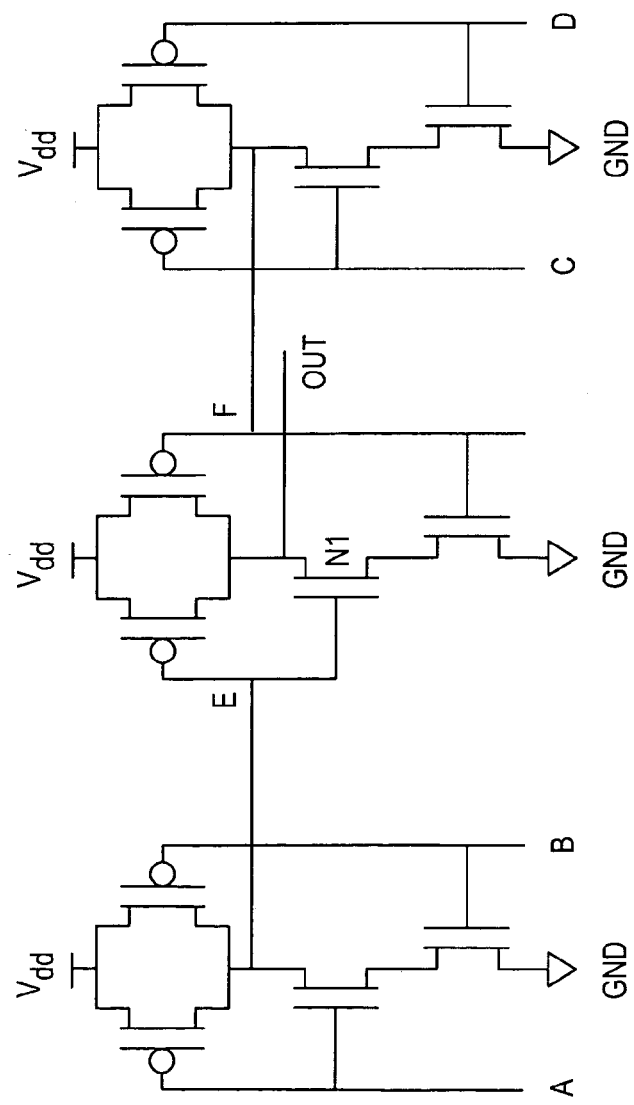
FIG. 11 is a CMOS circuit including three NAND gates.

The speedups obtained using these two different approaches apply to different paths through a circuit. Consider the circuit of FIG. 11, which shows two NAND gates with inputs A, B, and C, D, respectively, that then drive the third NAND gate (with two nodes E, F, as its inputs). Here we consider the effect of changing N1, the NMOS transistor in this third NAND gate with node E as its gate connection, into a low-threshold device.

If the threshold of N1 is reduced, and the device size left unchanged, then the rate at which the path from the output to Gnd sinks current is increased. Any change of input state that causes the output to go low will propagate faster. This applies both to changes in A or B, as well as to changes in C or D, even though C and D do not propagate through node E, and are therefore not coupled to the gate of N1. However, there will be no change in delay for any change in input state that causes the output to go high, since such changes will not benefit from the increased ability of N1 to sink current.

If the threshold of N1 is reduced, and the device size is also reduced to maintain the same current carrying capacity, then the ability of the path between output and Gnd to sink current is unchanged. However, the gate capacitance on node E is reduced. Thus any transition that propagates via node E will be faster, both those that cause the output to rise and those that cause it to fall. Transitions that do not propagate via node E (i.e. those on inputs C and D, that propagate via node F) will have no speedup.

Thus, by choosing how to use the low-threshold transistors the designer can choose to speed up certain edges (such as the falling output edge in the first example above), or to speed up certain paths (such as the path through node E in the second example).

To achieve an overall circuit design that does not suffer from excessive leakage it is preferable to follow the following principles, that are based on the above description of the effects of using low-threshold transistors:

Use low-threshold transistors in gates in the speed-critical parts of the design only.

To speed up an edge, use normal-sized low-threshold transistors.

To speed up a path, use reduced-size low-threshold transistors.

In circuits where not all input combinations are permitted, try to ensure that there is always at least one off high-threshold transistor between $V_{dd}$ and Gnd for all valid input combinations.

In situations where increased leakage is unavoidable, try to keep the number of input combinations that result in increased leakage (i.e. that do not have an off high-threshold transistor between $V_{dd}$ and Gnd) to a minimum. Alternatively, try to ensure that each possible path through either the NMOS or the PMOS networks of the CMOS gate can be set to a low leakage state, so that there are at least some input combinations that do not result in increased leakage. To further reduce the number of input combinations that result in leakage above that expected for a high threshold transistor path, ensure that each possible path through both the NMOS and PMOS networks can be set to a low leakage state. Where both networks can be set to a low leakage state, input combinations that result in both high and low level outputs are possible while maintaining low leakage. This is equivalent to the following:

- n-input NAND gates should contain either no more than n−1 low-threshold NMOS transistors, or no low-threshold PMOS transistors. To further reduce the number of input combinations that cause leakage, both of these conditions should be met.
- n-input NOR gates should contain either no more than n−1 low-threshold PMOS transistors, or no low-threshold NMOS transistors. To further reduce the number of input combinations that cause leakage, both of these conditions should be met.
- In compound gates (such as the AND-OR-Invert gate of FIG. 10C) that contain parallel arrangements of serial transistors, at least one transistor in each serial chain should be high-threshold.
- In compound gates (such as the AND-OR-Invert gate of FIG. 10C) that contain serial arrangements of parallel groups of transistors, at least one such parallel group should contain all high-threshold transistors.

Figure 12:
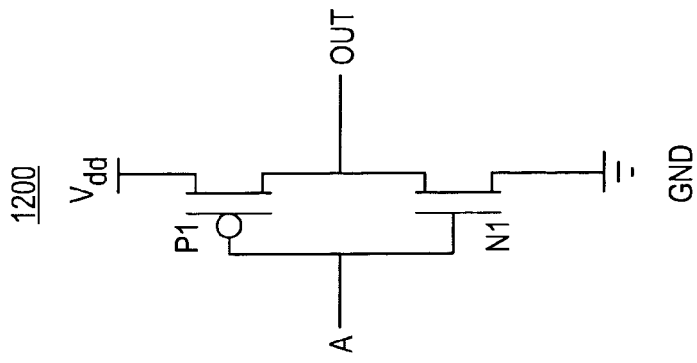
FIG. 12 is a CMOS inverter circuit.

Requiring that all paths through a gate can be set to be low leakage, however, sometimes leads to undesired results. For example, this would require that low-threshold transistors not be used in inverters. Turning to FIG. 12, an inverter 1200 has an input A and an output OUT, a single NMOS transistor N1 in the NMOS (pulldown) network, and a single PMOS transistor P1 in the PMOS (pullup) network. If either of these transistors is changed to a low-threshold type there will be a data-dependent significant increase in leakage through the inverter, whenever the input signal causes the low-threshold type transistor to be turned off. For example, if the transistor N1 is low threshold, then whenever the input A is low, the transistor N1 is turned off, and therefore causes significant leakage through the transistor N1, since the drain-source voltage across transistor N1 is substantially equal to $V_{dd}$. Similarly, if the transistor P1 is low threshold, then whenever the input A is high, the transistor P1 is turned off, and therefore causes significant leakage through the transistor P1, since the drain-source voltage across transistor P1 is substantially equal to $V_{dd}$.

As is discussed in further detail below, in an embodiment a circuit is provided that can be configured to enter a low leakage state, which can take account of data-dependent leakage, such as that caused by use of low-threshold devices in CMOS gates such as inverters. An example of a circuit that can easily be configured into a low leakage state is a reconfigurable circuit such as that found in an FPGA or an RAA. In alternate embodiments, however, other forms of circuits are placed into a low leakage state, such as tri-state drivers, buffers, bus switches, and barrel shifters. In another alternate embodiment, circuits having scan chains are placed into a low leakage state. Those skilled in the art will appreciate that a wide variety of circuits may be advantageously placed into a low leakage state using the teachings disclosed herein.

As an initial matter, it is noted that leakage current through a MOS component such as a MOS transistor only occurs when the transistor is off and there is a voltage difference between the drain and the source of the transistor. Thus, where a circuit can be configured such that there is no voltage difference between the drains and sources of the transistors in the circuit, leakage is substantially eliminated, regardless of whether the transistors are high or low-threshold transistors.

Figure 13:
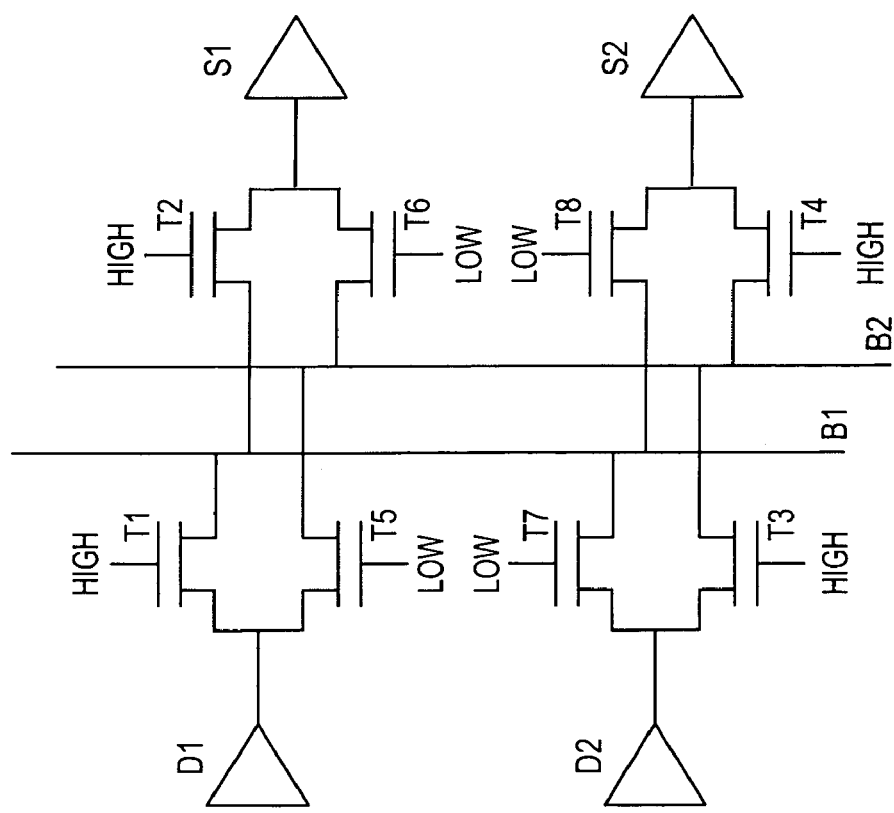
FIG. 13 is a partial fraction of the routing network of a reconfigurable device.

Turning to FIG. 13, there is shown a sample fraction of the routing network of a reconfigurable device, where drivers D1 and D2 are driving data into the routing network, and sinks S1 and S2 are receiving data from the network. Busses B1 and B2 carry signals to and from the various transistors T1–T8. In this example, transistors T1 and T2 are switched on to create a path from D1 to S1, and transistors T3 and T4 are switched on to create a path from D2 to S2. Transistors T5, T6, T7, and T8 are switched off. If D1 is driving a high signal into the routing network, and D2 a low signal, then all of T5, T6, T7, and T8 have a voltage difference between their sources and drains, and will therefore have leakage currents flowing through them.

For example, transistor T5 has a voltage difference because the drain of transistor T5 is receiving a high signal directly from D1, whereas the source of transistor T5 is receiving a low signal from D2, via the path through transistor T3 to bus B2 to the source of transistor T5. Similarly, transistor T6 has a voltage difference because the source of transistor T6 is receiving a low signal from D2, via the path through transistor T3 to bus B2 to the source of transistor T6, whereas the drain of transistor T6 is receiving a high signal from driver D1 via the path through transistor T1 to bus B1 to transistor T2 to the drain of transistor T6. Transistors T7 and T8 similarly have voltage differences.

However, if D1 and D2 both drive high signals, or both drive low signals, into the routing network, then there will be no voltage difference between source and drain for any of T5, T6, T7, and T8. For example, considering transistor T7, driver D1 drives a high signal through transistor T1 to bus B1 to the drain of transistor T7, and driver D2 drives a high signal directly to the source of transistor T7. The other transistors T5, T6, T8 similarly have no voltage difference when D1 and D2 drive the same value into the routing network. Thus, leakage in the routing network can be substantially eliminated if all drivers feed the same value into the network. This is the case even if all of T1 to T8 are low threshold devices that are typically susceptible to high leakage currents. Since low threshold transistors are capable of creating fast paths through the routing network, placing the reconfigurable device into a low leakage state using this condition where all active drivers provide the same signal level to the routing network (referred to as the equipotential drive condition) is useful in obtaining the benefits of both fast signal propagation through the routing network in normal operation and low leakage in standby mode.

Figure 14:
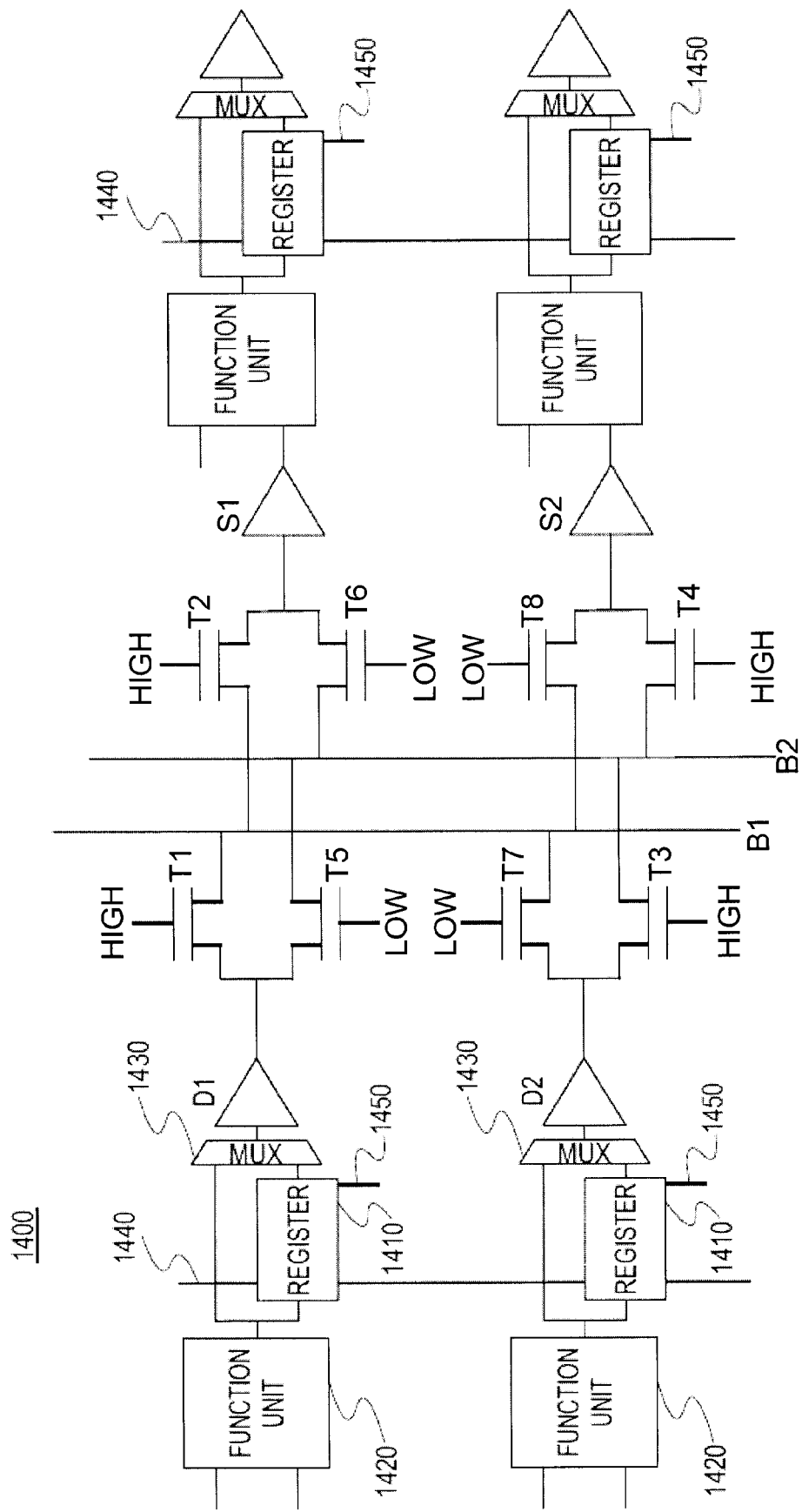
FIG. 14 is an expanded view of the routing network and associated functional units of a portion of a reconfigurable device.

In many reconfigurable device circuits, optional registers are placed immediately before the drivers for the routing network. Turn to FIG. 14, showing a larger fraction of a reconfigurable device 1400 incorporating the routing network of FIG. 13, and showing registers 1410 between functional units 1420 and the drivers D1, D2 for the routing network, together with multiplexers 1430 that allow them to be selected or deselected. Equipotential drive to the routing network is implemented by configuring these registers 1410 to have them all drive the routing network with the same signal level. For example, the registers 1410 are configured to drive the drivers D1, D2 both with high signals. Alternatively, the registers 1410 are configured to drive the drivers D1, D2 both with low signals. As will be discussed further below, this design choice may be influenced by other considerations in reducing leakage for other components of the reconfigurable device.

There are several ways in which the equipotential drive condition can be achieved for the routing network of the reconfigurable device:

1. In some cases, depending on the particular configuration of the functional units 1420 within the reconfigurable device, there will be a data sequence that can be applied to the main data inputs of the reconfigurable device, such that the function performed by the device results in the same value being present at all inputs to the routing network. For example, if all of the functional units 1420 are configured to function as buffers, then applying a data sequence of all ones, or all zeros, to the main data inputs will cause the device to buffer the input, and result in the same value (all ones if input was ones, all zeros if input was zeros) to be present at all inputs to the routing network.

2. Alternatively, the device can be reconfigured in order to load a dedicated "low-leakage" configuration that guarantees all drivers will provide the same value to the routing network. This reconfiguration can be loaded into the reconfigurable device via a reconfiguration port, which gives access to the registers and other elements within the reconfigurable device that are to be reconfigured. For example, the device can be reconfigured such that all of the functional units 1420 output the same value, or such that all of the registers 1410 output the same value. The values stored in the registers 1410 may optionally be saved prior to the reconfiguration, to preserve the state of the application previously configured onto the reconfigurable device.

3. As further alternative, some reconfigurable devices allow "partial reconfiguration"—a programming operation that changes just a part of the configuration of the device while the rest remains unchanged. Following are several examples of how this feature can be used to set up the equipotential drive condition:

a) A partial reconfiguration selects and updates the registers 1410 in FIG. 14 to cause those registers 1410 to all output the same value, but leaves the function units 1420 and routing connections (transistors T1–T8 in FIG. 13) unchanged.

b) A partial reconfiguration that uncouples all drivers (D1, D2) that are not outputting the required equipotential value, and creates new couplings to ensure inputs remain coupled to a voltage source of some kind, rather than being allowed to float. For example new couplings are created to couple the inputs to a constant-value logical '0' or '1' source, or some other source within the reconfigurable device that is outputting the required equipotential value.

4. Some devices have a "global reset"—a signal 1450 that couples to all registers, and forces them to a known state (normally all register are set to store a 0). This global reset 1450 will also cause all of the drivers to the routing network to output the same value, thus creating the desired equipotential value condition.

5. Alternatively, the registers 1410 can be modified to have an extra input, driven by a "standby mode select" signal, whose function is to cause the registers 1410 to output a constant value. This differs from the global reset discussed above in that it leaves the register contents unchanged and just affects the output value. Thus the state of the registers 1410 during operational mode is preserved, while still allowing the reconfigurable device to enter the equipotential drive condition desired for the standby mode.

These alternative ways of setting the equipotential drive condition can be divided into two main types:

Those that preserve the state of the application configured onto the reconfigurable device (i.e. where the contents of the registers 1410 can be preserved). Item 5 on the above list falls into this category, as do 2 and 3 provided the register data is saved prior to the reconfiguration and restored by a further partial reconfiguration on leaving the standby state.

Those that destroy the state of the application, such as items 1 and 4 on the above list, and items 2 and 3 if the register data is not saved before reconfiguration and restored later.

For some applications it is not necessary to preserve the application state during standby, so that the application resumes in the same state it was in before entering standby, but for many others it is. This makes a mechanism that can preserve state the preferable way to implement the standby mode, though alternative embodiments that do not preserve the application state are also possible.

In most reconfigurable devices there are elements other than the function units and registers, which can drive the routing network. For example:

Inputs from outside the reconfigurable circuit, such as test inputs, application data inputs, control signal inputs, etc.

Constant value drivers (e.g. to provide a logic '0' or '1').

Outputs from special purpose function blocks.

Unregistered outputs from function blocks

For the equipotential drive condition to be met, all other active elements or drivers coupled to the routing network must also drive the same signal level. These elements can be caused to drive the equipotential drive value in the same ways as described above.

As an example, consider the case of a reconfigurable device whose low-power standby state is chosen to be where all active drivers drive CMOS highs (logic '1') into the routing network, implemented by partial reconfiguration and updating of register contents. This partial reconfiguration achieves the following:

Load highs into all registers.

Uncouple all constant 0s from the routing network, and update the routing if necessary to ensure that all routes previously driven by a constant 0 are still coupled to a driven signal. For example (if the device contains constant 1 drivers), all coupling to constant 0s could be replaced with couplings to constant 1s.

Uncouple (and update the routing of) all inputs, or alternatively set the inputs to drive highs into the routing network.

Uncouple (and update the routing of) all outputs from special purpose function blocks, or alternatively update the configuration of such blocks to ensure that their outputs are all high.

Setting such a reconfigurable device into a low-power standby state, and restoring it to normal operation proceeds according to the following sequence of operations:

1. Stopping the normal operation of the device.
2. Saving the state of the registers.
3. Loading a partial configuration as described above.

(At this point the device is in its low-power standby state)

4. Loading a new partial configuration that restores register contents, and returns the routing network to its earlier configuration (i.e. with constants, inputs, etc. recoupled).
5. Restarting the normal operation of the device.

The previous section described how to place a routing network in a reconfigurable device in a low power standby mode, by loading it with a configuration that ensures that all forms of driver to the routing network are driving the same value, according to an embodiment of the invention.

There may be low threshold transistors used elsewhere in the reconfigurable device, and this may impose additional constraints on the preferred configuration of the device for standby mode—for example these transistors may determine the choice of value for the equipotential drive condition (whether all drivers should provide highs or lows). Alternatively, where the equipotential drive condition is known ahead of time, it becomes possible to design the reconfigurable device to use low-threshold transistors in parts of the circuits within the device, while still maintaining the ability to switch into a low-leakage standby state.

To continue with the previous example embodiment, recall that the equipotential drive condition is defined such that in standby mode the routing network contains only highs. This means that the standby state of any node in the device that is directly or indirectly coupled to the routing network solely via combinatorial logic paths can itself be fixed in standby mode. A combinatorial path is a path that does not include a register or other memory element. The state of a node that has only combinatorial paths to the routing network is determined solely by the current state of the routing network. As explained above, there are some types of logic gates that can be constructed using low-threshold transistors (that have high leakage) for some combinations of inputs and not for others. Such circuits can therefore be used in the reconfigurable device of an embodiment, provided that the known states of all their inputs, when in standby mode, are not ones that cause high leakage within the logic gate.

Figure 15:
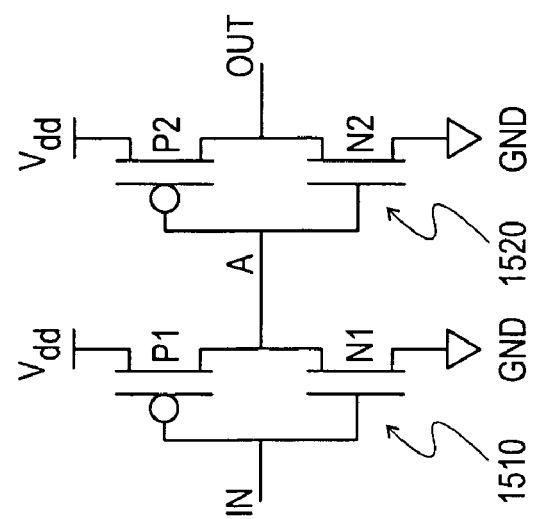
FIG. 15 is a driver circuit for a reconfigurable device.

For example, FIG. 15 shows an example circuit for a driver such as the drivers D1, D2 of FIGS. 13 and 14. The circuit includes two inverters, a first inverter 1510 constructed from transistors N1 and P1, and a second inverter 1520 constructed from transistors N2 and P2. The low-power standby state discussed above places a high in the register 1410 that provides the input for this driver. The first inverter 1510 inverts the high input signal and outputs a low signal to the internal node, A. This low signal is passed to the second inverter 1520, which inverts the signal and outputs a high output signal to the routing network. To ensure there is no leakage in the standby state, transistors P1 and N2 must be high-threshold devices, since these two transistors are turned off by the high input signal and the low signal propagated through internal node A. However, either or both of N1 and P2 can be low-threshold without causing increased leakage in the standby state, since both of these transistors are turned on and thus do not have a leakage current. Since NMOS transistor-only-based routing networks (like those shown in FIGS. 13 and 14) typically propagate falling edges faster than rising edges it is useful to be able to use a low-threshold (and therefore faster) pullup transistor P2 in the driver output to increase the speed of the rising edge.

Thus the ability to set a low-power standby state for the routing network by reconfiguration (whether full or partial) means that the restriction on the use of low-threshold transistors in inverters (and other gates that can have input state dependent leakage currents) described above can be relaxed, which gives the designer a greater freedom to make tradeoffs between high performance in normal operation and low leakage in standby.

Figure 16A:
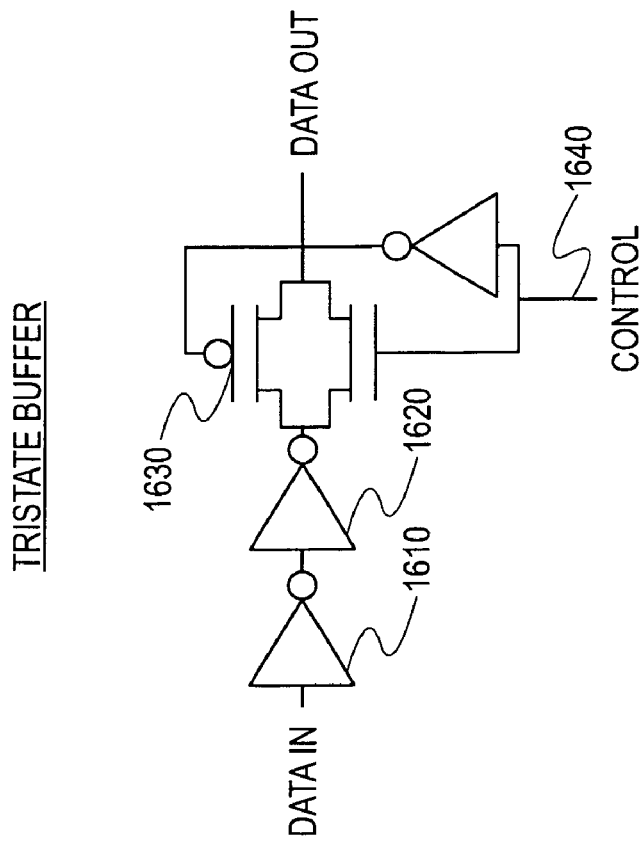
FIG. 16A is a tri-state driver circuit

The principles taught above may also be applied to a wide variety of circuit types other than reconfigurable logic device circuits. In general, the leakage current through the channel of any transistor can be minimised by equalising the voltages at each end of the channel—i.e. the source and drain of the transistor. For example, there are particular circuit styles where leakage currents can be significantly reduced using the teaching disclosed herein:

Turning to FIG. 16A, a tri-state driver is built using a buffer constructed from a pair of inverters 1610, 1620, followed by a pass transistor (as in FIG. 7) or pass gate (as in FIG. 8). FIG. 16A depicts a pass gate 1630. The pass gate is enabled or disabled via the control signal 1640. In this case, leakage current through the pass transistor or pass gate of a disabled driver can be minimised by setting the signal which the buffer would drive if it were enabled to equal the level on the wire which would be driven by the tri-state driver.

Buffers in which one of the final drive transistors has a higher leakage current than the other. This is the same situation as considered in the discussion of FIG. 15 above, where the PMOS transistor P2 in the complementary buffer 1500 may be made a low-threshold device to increase the speed of the rising edge, and so compensate for the fact that rising edges are typically slower than falling edges in CMOS technology. The leakage current across the PMOS transistor P2 might be larger than that across the NMOS transistor N2 in the same buffer, so leakage current would be minimised by setting the output level of the buffer to a level which equalises the voltages at each end of the channel of the PMOS transistor P2—i.e. set the output of the buffer to a high voltage level, which corresponds to setting the gate of the PMOS transistor P2 to a low. If the buffers in question are large or numerous, the reduction in leakage current could be significant.

Bus switches formed of pass transistors or pass gates. In this case, the leakage current can be minimised by setting the values on both source and destination buses to the same value. This example is shown in the context of a reconfigurable device in FIGS. 13 and 14, and the associated discussion above.

Figure 16B:
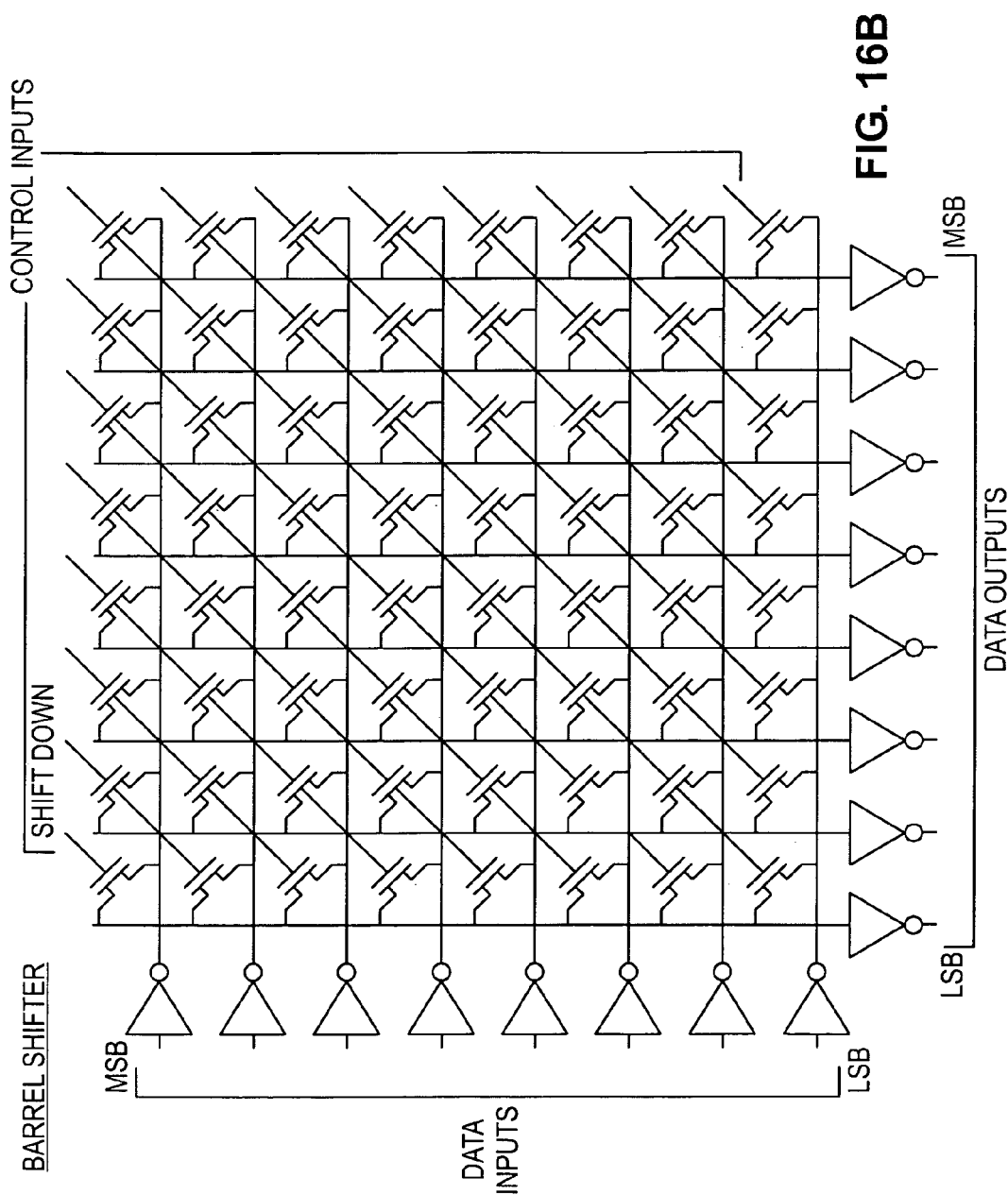
FIG. 16B is a barrel shifter circuit.

Barrel shifters formed of a grid of pass transistors or pass gates, one for every pair of input wire and output wire, as shown in FIG. 16B. In this case, the leakage current can be minimised by setting all bits of the data input word to the same value. Doing so causes the voltage levels on all of the wires in the barrel shifter to equalize, and thus since the grid of pass transistors is connected to the various wires, the voltage levels on the source and drain of each transistor is also equalized, thus causing the equipotential state discussed above, which results in low leakage.

Figure 17:
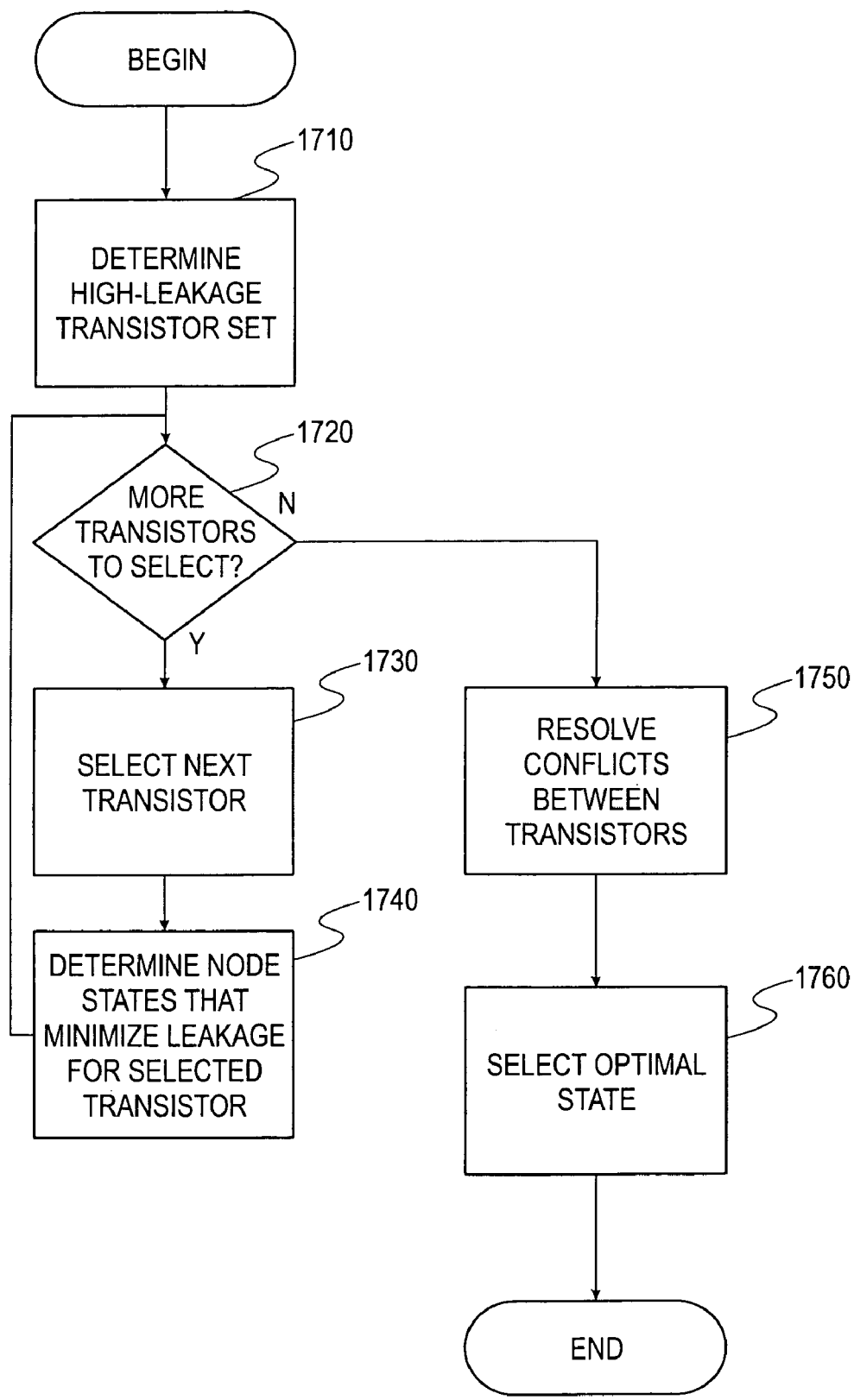
FIG. 17 is a flowchart of a method for determining the minimum possible leakage current in a circuit.

The method of FIG. 17 shows the steps to be taken to determine the states of the nodes of a circuit that will give an approximation to the minimum possible leakage current in the circuit. At step 1710, the set of high leakage transistors in the circuit (normally a small proportion) is determined. At step 1720, a check is made to see if there are more transistors to evaluate leakage currents for. Assuming there are, then at step 1730 the next transistor is selected. At step 1740, for each high leakage transistor the combinations of node states that will minimise leakage through the transistor is determined. The method then returns to step 1730. Once all transistors have been evaluated, then at step 1750, if there are conflicts between the node state requirements for different high leakage transistors, these conflicts are resolved by giving priority to the transistors with the highest leakage, to determine an overall set of node states that minimises total leakage. For example, assume a circuit has two high leakage transistors N1 and P2. N1 has a minimum leakage current when the input to the circuit is high, and P2 has a minimum leakage current when the input is low. The leakage current through N1 when in its low-leakage state is higher than the leakage current through P2 when in its low-leakage state. Thus, the conflict is resolved by giving priority to N1. As an alternative, at step 1750 the leakage currents are calculated for all transistors in the circuit, for all possible input combinations, and the input combination which results in the lowest total leakage through all the transistors is selected as the low-leakage state to use in the circuit. The optimal state is selected at step 1760, and the method terminates.

Once the desired low-leakage state is identified, it is then applied to the circuit. The general case circuit may not have a configuration port that can be used to load these states, as was the case with the reconfigurable circuit discussed above. However, the other methods discussed above for loading a particular state into a circuit can be used where applicable, for example:

- Finding an input sequence that when applied to the primary data inputs will set the nodes to the states needed to minimise leakage.
- Exploiting any register reset mechanism available.
- Adding extra control signals to the device to be able to override node values with the required values for the low-leakage state.

Alternatively, many circuits incorporate additional hardware, such as test inputs 1440 for registers 1410 for test purposes, that can be easily modified to use for setting the low-leakage standby state and then restoring the application state on return to normal operation. This additional test hardware allows all the registers 1410 in a device to be chained together into one or more so-called "scan chains", and arbitrary patterns of data to then be fed through these chains to set the values of all registers 1410 in the device. The contents of the registers 1410 can also be read out of the circuit via these scan chains.

Figure 18:
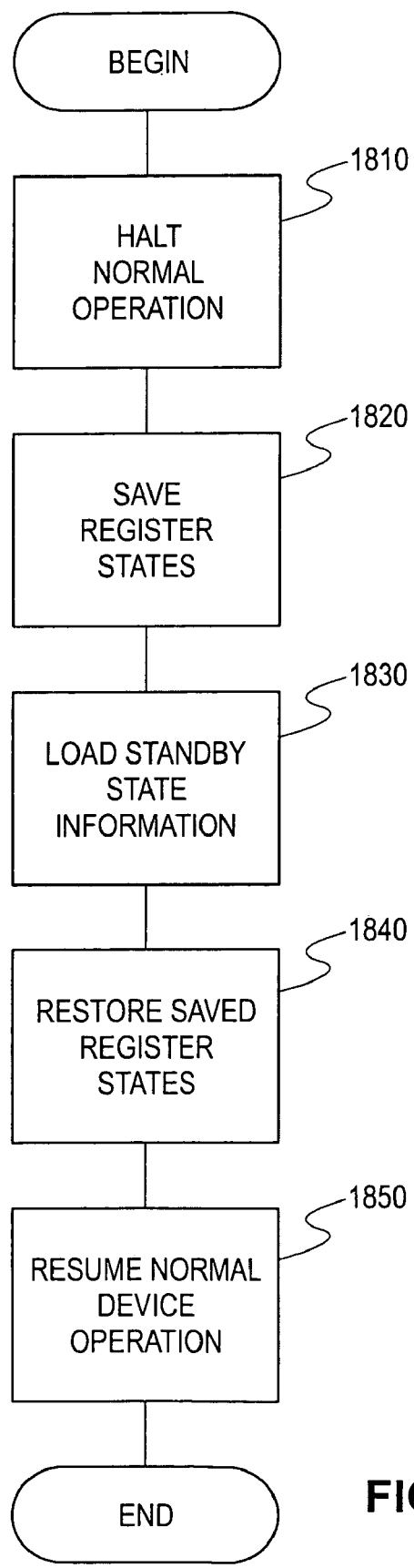
FIG. 18 is a flowchart of a method of using scan chains to configure a device into a low-leakage state.

Thus, in an embodiment, these scan chains in an arbitrary circuit are used in place of the configuration port of a reconfigurable device to enter and exit a low-power standby state according to the method of FIG. 18. At step 1810, the normal operation of the device is stopped. At step 1820, the state of the registers is saved, using the scan chains to read the register contents into memory. At step 1830, the low power standby state is loaded into the registers using the scan chains. Depending on the particular architecture of the arbitrary circuit, the process of loading the standby state into the registers described at step 1830 may be commenced before the register contents have been completely read out of the registers at step 1820. For example, once the first value has been read out of the register at the end of the scan chain in step 1820, the first of the standby values may be loaded in at the beginning of the scan chain. As the values are read out of the end of the scan chain, the standby values propagate in at the beginning of the scan chain.

At this point, the circuit is in its low-power standby state. To exit standby mode, at step 1840, the register states are restored using the scan chains to read the stored register contents in from the memory. At step 1850, the normal operation of the device is restarted, and the method terminates. This use of the scan chains provides the designer with greater freedom to exploit tradeoffs between high performance in normal operation and low leakage in standby than would otherwise be the case.

Finally, it should be noted that not all parts of an otherwise active circuit may be active at the same time, and so any of the techniques described above can be applied to inactive subsections of the circuit. For example, partial reconfiguration of a reconfigurable device can set the unused parts of the device to a low-leakage state, and similarly (if the scan chains are appropriately arranged) the low power state can be loaded into a subsection of a general device.

In the foregoing specification, the invention has been described with reference to specific embodiments thereof. It will, however, be evident that various modifications and changes may be made thereto without departing from the broader spirit and scope of the invention. For example, the reader is to understand that the specific composition and combination of components shown in the circuit diagrams described herein is merely illustrative, and the invention can be performed using different or additional components, or a different combination or composition of components. Where the foregoing disclosure has been made using transistors as examples of circuit components, other components such as diodes or capacitors may be substituted as alternatives. The specification and drawings are, accordingly, to be regarded in an illustrative rather than restrictive sense, and the invention is not to be restricted or limited except in accordance with the following claims and their legal equivalents.

We claim:

1. A circuit, comprising: a data input, a data output, a first voltage supply input, a second voltage supply input, a high threshold device electrically coupled between the data input and the data output, and electrically coupled between the first and second voltage supply inputs, and a low threshold device electrically coupled between the data input and the data output, and electrically coupled between the first and second voltage supply inputs; wherein the circuit is adapted to be switched to a low leakage state by providing a signal on the data input that causes the circuit to enter the low leakage state.

2. The circuit of claim 1, wherein the low leakage state comprises a leakage current path from the first voltage supply input to the second voltage supply input, the leakage current path flowing through the high threshold device, the high threshold device being turned off.

3. The circuit of claim 1, wherein the low leakage state comprises a standby mode for the circuit.

4. The circuit of claim 1, wherein the first voltage supply input comprises a CMOS high voltage supply input.

5. The circuit of claim 1, wherein the second voltage supply input comprises a CMOS low voltage supply input.

6. The circuit of claim 1, wherein the high threshold device comprises a MOS device.

7. The circuit of claim 6, wherein the MOS device comprises a transistor.

8. The circuit of claim 1, wherein the low threshold device comprises a MOS device.

9. The circuit of claim 8, wherein the MOS device comprises a transistor.

10. The circuit of claim 1, further comprising a second data input, a second high threshold device electrically coupled between the second data input and the data output, and electrically coupled between the first and second voltage supply inputs, and a second low threshold device electrically coupled between the second data input and the data output, and electrically coupled between the first and second voltage supply inputs, wherein the circuit is adapted to be switched to a low leakage state by providing a second signal on the second data input which in combination with the signal on the first data input causes the circuit to enter the low leakage state.

11. The circuit of claim 1, wherein the circuit comprises a controlled buffer.

12. The circuit of claim 1, wherein the circuit comprises a driver circuit.

13. The circuit of claim 1, further comprising a first register electrically coupled to the data input, the register comprising a test input, wherein the first register is adapted to provide the signal on the data input, and wherein the first register is adapted to receive a signal on the test input, and propagate that signal to the data input.

14. The circuit of claim 13, wherein the first register is one of a plurality of registers coupled together by a scan chain, the scan chain adapted to receive a series of data values and to load the series of data values into the plurality of registers.

15. The circuit of claim 14, wherein the circuit is adapted to be placed into a low leakage state by supplying a pre-determined series of data values to the scan chain, loading the predetermined series of data values into the plurality of registers, causing the first register to propagate one of the pre-determined data values to the data input, and causing the circuit to enter the low leakage state.

16. The circuit of claim 1, wherein the circuit comprises an integrated circuit.

17. A circuit, comprising: a data input, a data output, a low threshold device electrically coupled between the data input and the data output, a control input adapted to receive a control signal for controlling the low threshold device, and a register electrically coupled between the data input and the low threshold device, the register adapted to provide a register value to the low threshold device; wherein the circuit is adapted to be placed into a low leakage state by causing the register value to be a low leakage value, which causes the circuit to enter the low leakage state, and wherein the low threshold device is electrically coupled to the control input.

18. The circuit of claim 17, wherein the data output comprises a data output value of a first voltage level, and the low leakage value comprises a second voltage level substantially equivalent to the first voltage level.

19. The circuit of claim 17, wherein the register value is caused to be a low leakage value by providing the low leakage value as an input on the data input.

20. The circuit of claim 17, wherein the register further comprises a configuration input, and the register value is caused to be a low leakage value by providing the low leakage value as an input on the configuration input.

21. The circuit of claim 17, wherein the register further comprises a reset input, and the register value is caused to be a low leakage value by providing a reset signal to the reset input.

22. The circuit of claim 17, wherein the register further comprises a test input, and the register value is caused to be a low leakage value by providing the low leakage value as an input on the test input.

23. The circuit of claim 22, wherein the register is one of a plurality of registers, the plurality of registers coupled together by a scan chain, the scan chain adapted to receive a series of data values and to load the series of data values into the plurality of registers.

24. The circuit of claim 23, wherein the circuit is adapted to be placed into a low leakage state by supplying a pre-determined series of data values to the scan chain, loading the predetermined series of data values into the plurality of registers, causing the first register to propagate one of the pre-determined data values as the register value to the low threshold device, and causing the circuit to enter the low leakage state.

25. The circuit of claim 17, wherein the low threshold device comprises a pass transistor.

* * * * *